United States Patent
Hsieh et al.

(10) Patent No.: US 9,728,445 B2
(45) Date of Patent: Aug. 8, 2017

(54) METHOD FOR FORMING CONDUCTING VIA AND DAMASCENE STRUCTURE

(71) Applicant: Taiwan Semiconductor Manufacturing Co., Ltd, Hsin-Chu (TW)

(72) Inventors: Wen-Kuo Hsieh, Taipei (TW); Ming-Chung Liang, Hsin-chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 40 days.

(21) Appl. No.: 14/161,258

(22) Filed: Jan. 22, 2014

(65) Prior Publication Data

US 2015/0206792 A1    Jul. 23, 2015

(51) Int. Cl.
*H01L 21/768* (2006.01)
*H01L 21/311* (2006.01)

(52) U.S. Cl.
CPC .. *H01L 21/76807* (2013.01); *H01L 21/31116* (2013.01); *H01L 21/31144* (2013.01); *H01L 21/76816* (2013.01)

(58) Field of Classification Search
None
See application file for complete search history.

(56) References Cited

U.S. PATENT DOCUMENTS

| | | | | |
|---|---|---|---|---|
| 6,165,898 A * | 12/2000 | Jang et al. | ............... | 438/638 |
| 6,410,462 B1 * | 6/2002 | Yang | .............. | C23C 16/401 |
| | | | | 257/635 |
| 2002/0076935 A1 * | 6/2002 | Maex | ............... | G03F 7/094 |
| | | | | 438/706 |
| 2002/0084254 A1 * | 7/2002 | Yatsuda et al. | ............. | 216/67 |
| 2002/0145200 A1 * | 10/2002 | Dalton | ......... | H01L 21/76801 |
| | | | | 257/762 |
| 2002/0177322 A1 * | 11/2002 | Li et al. | .................. | 438/710 |
| 2005/0287811 A1 * | 12/2005 | Inukai | .................. | 438/700 |
| 2007/0032058 A1 * | 2/2007 | Sung | ............ | H01L 21/76835 |
| | | | | 438/597 |
| 2010/0308469 A1 * | 12/2010 | Tsai et al. | .................. | 257/774 |
| 2013/0017672 A1 * | 1/2013 | Kuboi | ............ | H01J 37/32082 |
| | | | | 438/477 |

* cited by examiner

*Primary Examiner* — Andres Munoz
(74) *Attorney, Agent, or Firm* — Birch, Stewart, Kolasch & Birch, LLP

(57) ABSTRACT

In accordance with some embodiments, a method for forming via holes is provided. The method includes providing a substrate with an etch stop layer and a dielectric layer sequentially formed thereon. The method also includes etching the dielectric layer to form a first via hole of a first size and a second via hole of a second size within the dielectric layer by a plasma generated from an etch gas, until both the first via hole and the second via hole are reaching the etch stop layer. The etch gas includes $CH_2F_2$ and an auxiliary gas of $N_2$ or $O_2$.

15 Claims, 10 Drawing Sheets

METHOD FOR FORMING CONDUCTING VIA AND DAMASCENE STRUCTURE

BACKGROUND

Semiconductor devices are used in a variety of electronic applications, such as personal computers, cell phones, digital cameras, and other electronic equipment, for example. As technology has progressed, the demand for smaller semiconductor devices with improved performance has increased. As feature densities increase, widths of conductive lines and spacing between the conductive lines of back-end of line (BEOL) interconnect structures also need to be scaled smaller.

In order to meet these demands, a move away from the traditional materials used in the past is being made in semiconductor device design. To reduce an RC time delay, low dielectric constant (low-k) materials are being used as insulating materials, and there is a switch being made to use copper, rather than aluminum, as an interconnect material. The advantages of using copper for semiconductor device interconnects include the ability to operate faster and to manufacture thinner conductive lines, because copper has lower resistivity and better electromigration resistance compared to aluminum. Combining copper interconnects with low-k dielectric materials increases interconnect speeds by reducing the RC time delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
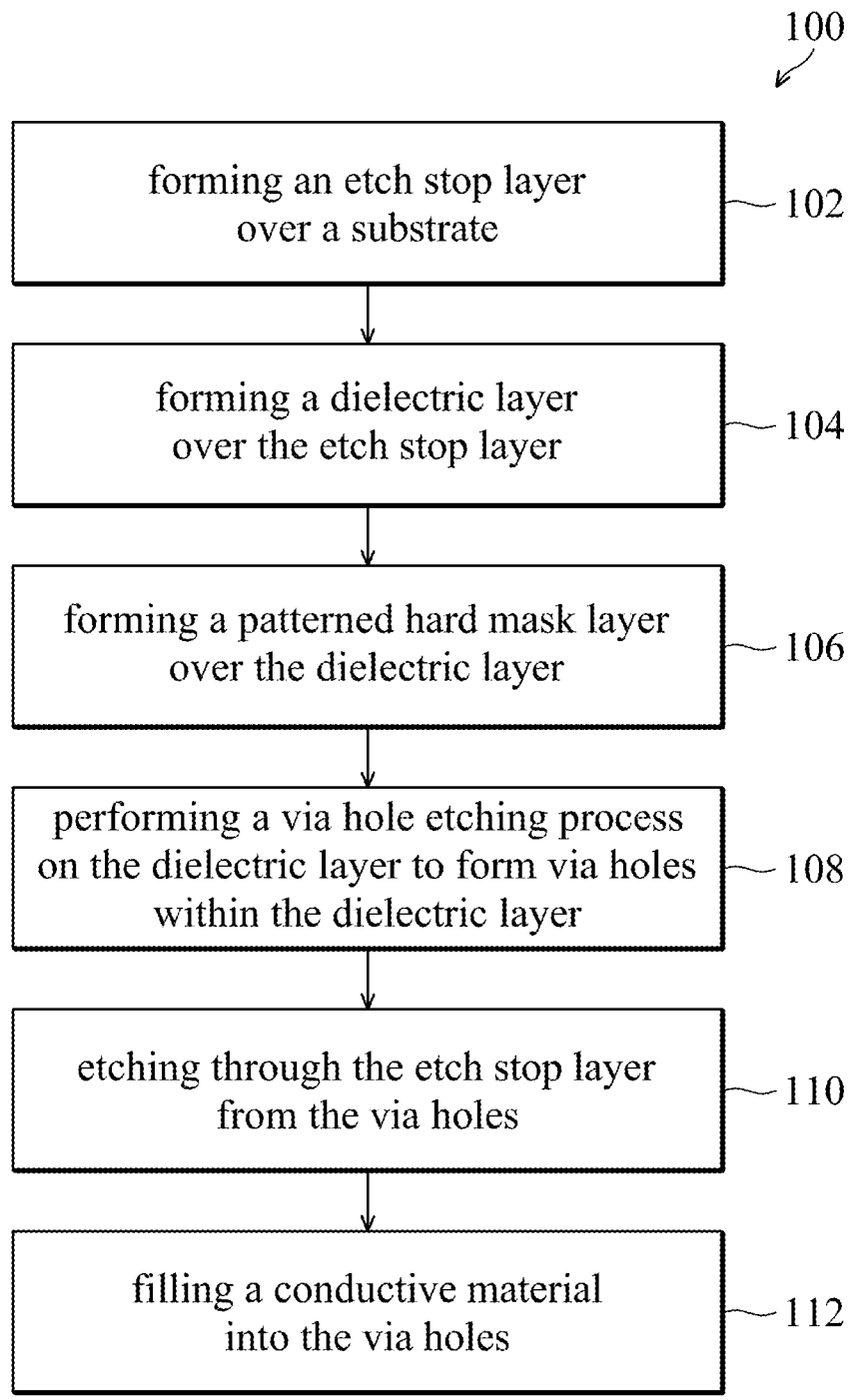
FIG. 1 shows a flow chart illustrating a method for fabricating an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a flow chart illustrating a method 100 for fabricating an integrated circuit, in accordance with some embodiments. Additional processes may be provided before, during, or after the method 100 of FIG. 1. FIGS. 2A-2F are cross-sectional views of an integrated circuit 200 at various stages of fabrication with reference to the method 100 of FIG. 1, in accordance with some embodiments. Various figures have been simplified for better understanding of the concepts of the present disclosure.

Figure 2A:
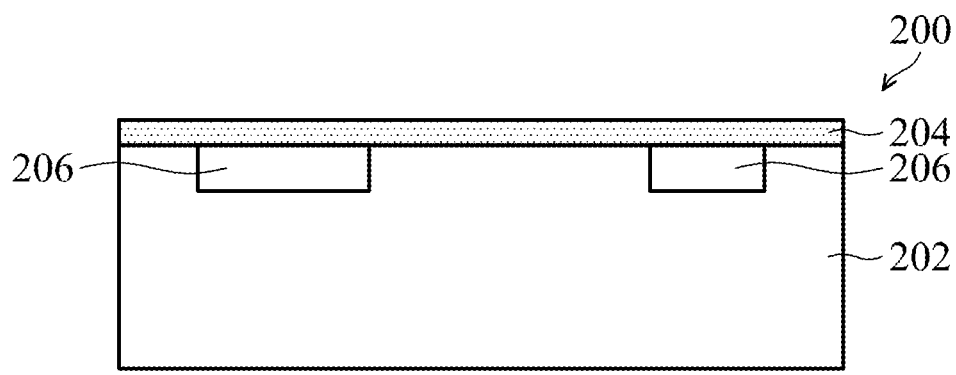
FIGS. 2A-2F are cross-sectional views of an integrated circuit at various stages of fabrication with reference to FIG. 1, in accordance with some embodiments.

Referring to FIG. 1, the method 100 starts at operation 102, in which an etch stop layer (ESL) is formed over a substrate. Referring to FIG. 2A, an etch stop layer 204 is formed over a substrate 202, in accordance with some embodiments. In some embodiments, the substrate 202 includes silicon. In other embodiments, the substrate 202 includes an elementary semiconductor including silicon and/or germanium in crystal; a compound semiconductor including silicon carbide, gallium arsenide, gallium phosphide, indium phosphide, indium arsenide, and/or indium antimonide; an alloy semiconductor substrate include SiGe, GaAsP, AlInAs, AlGaAs, GaInAs, GaInP, and/or GaInAsP; or a combination thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate includes a doped epi layer.

The substrate 202 may include various doped regions depending on design requirements (e.g. p-type wells or n-type wells). The doped regions may be doped with p-type dopants, such as boron or $BF_2$; n-type dopants, such as phosphorous or arsenic; or a combination thereof. The doped regions may be formed directly in the substrate, in a P-well, in an N-well, in a dual-well structure, or using a raised structure. The semiconductor device may include a PFET device and/or an NFET device, and therefore the substrate 202 may include various doped regions configured for the PFET device and/or the NFET device. In some embodiments, the substrate 202 further includes a number of other devices, such as resistors, capacitors, inductors, fuses, etc. For the sake of simplicity, the various doped regions and devices formed in the substrate 202 are collectively referred to as devices 206 in the following description and shown in FIGS. 2A-2F.

The etch stop layer 204 is formed over the substrate 202 for controlling an end point during subsequent etching processes. In some embodiments, the etch stop layer 204 includes silicon carbides, such as silicon carbide (SiC), silicon carbon nitride (SiCN), silicon carbon oxide (SiOC) or a combination thereof. In some embodiments, the etch stop layer 204 includes multi-sub-layers and has a thickness ranging from about 100 angstroms to about 300 angstroms. For example, the etch stop layer 204 may have three sub-layers, and the middle sub-layer has a comparatively low dielectric constant than that of the other two sub-layers. In some embodiments, the etch stop layer 204 is formed by a variety of deposition techniques, including low-pressure chemical vapor deposition (LPCVD), atmospheric-pressure chemical vapor deposition (APCVD), plasma enhanced chemical vapor deposition (PECVD), physical vapor deposition (PVD), sputtering and other suitable deposition techniques.

Figure 2B:
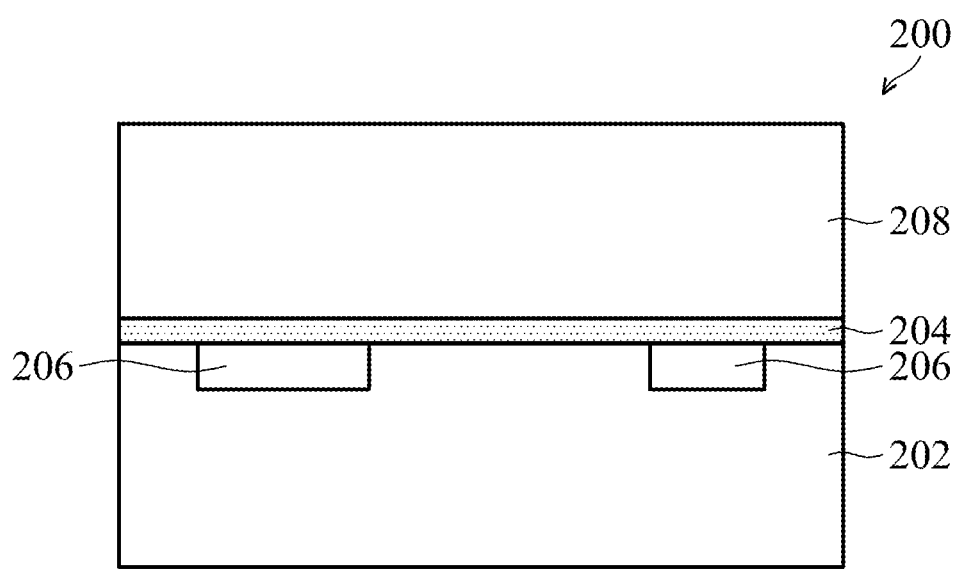

Referring to FIG. 1, the method 100 continues to operation 104, in which a dielectric layer is formed over the etch stop layer. Referring to FIG. 2B, a dielectric layer 208 is formed over the etch stop layer 204, in accordance with some embodiments. The dielectric layer 208 may be a single layer or a multi-layered structure. In some embodiments, the dielectric layer 208 includes a low-k dielectric material, silicon oxide layer or a combination thereof The low-k dielectric material has a dielectric constant less than about 3.0. In some embodiments, the dielectric layer 208 has a dielectric constant ranging from about 2.2 to about 2.6. A wide variety of low-k dielectric materials may be employed to form the low-k dielectric layer, including an inorganic low-k dielectric material including carbon doped silicon oxide, fluorinated silicon glass (FSG), xerogel or aerogel, and/or including Black diamond® (Applied Materials of Santa Clara, Calif.), amorphous fluorinated carbon, Parylene, BCB (bis-benzocyclobutenes), SiLK (Dow Chemical, Midland, Mich.), polyimide, and/or other future developed low-k dielectric materials. In some embodiments, the dielectric layer 208 functions as an inter-metal dielectric layer. In some embodiments, the dielectric layer 208 is formed by chemical vapor deposition (CVD), spin-on coating or other suitable techniques. The dielectric layer 208 may have a thickness ranging from about 1000 Angstroms to about 3000 Angstroms.

Figure 2C:
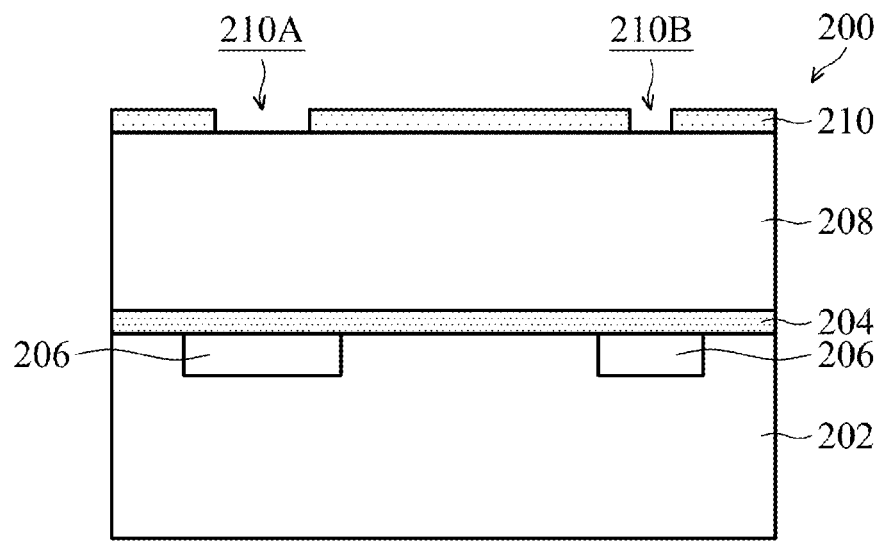

Referring to FIG. 1, the method 100 continues to operation 106, in which a patterned hard mask layer is formed over the dielectric layer. Referring to FIG. 2C, a patterned hard mask layer 210 is formed over the dielectric layer 210 and has openings 210A and 210B for defining via hole patterns. The openings 210A and 210B may have the same or different sizes although only different sizes are shown in FIG. 2C. The hard mask layer 210 may have a multilayer structure. In some embodiments, the hard mask layer 210 includes a pad layer (not shown), a masking layer (not shown) over the pad layer, and an imaging enhancement layer (not shown) over the mask layer. The pad layer, such as an oxide layer, acts as a stress buffer layer between the substrate 304 and the overlying dielectric layer. The masking layer may include a nitrogen-containing material, such as silicon nitride or silicon oxynitride. The imaging enhancement layer may include an organic layer, or a polymer layer or silicon-rich oxide (SRO). The imaging enhancement layer can enhance the accuracy of an image being transferred from an overlying photoresist layer. The hard mask layer 210 may be formed through a process such as chemical vapor deposition (CVD) or plasma enhanced chemical vapor deposition (PECVD).

Figure 2D:
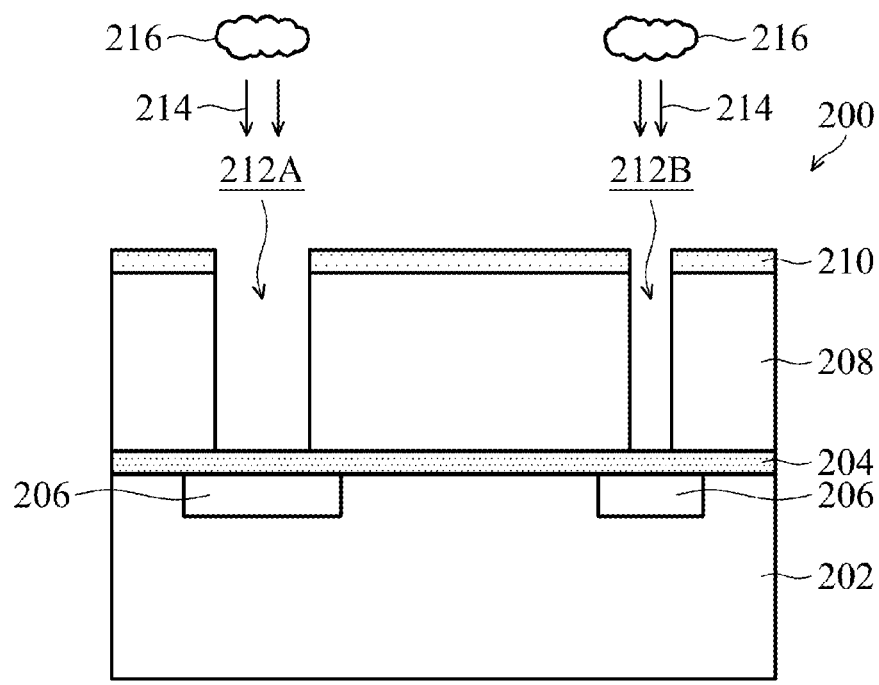

Referring to FIG. 1, the method 100 continues to operation 108, in which a via hole etching process is performed on the dielectric layer to form via holes within the dielectric layer. Referring to FIG. 2D, a via hole 212A of a first size and a second via hole 212B of a second size are formed by a via hole etching process 214, in accordance with some embodiments. The via hole etching process 214 may be a dry etch process, such as a reactive ion etching (RIE) process or other suitable plasma etch processes. The via hole 212A and the via hole 212B may have an aspect ratio ranging from 2 to about 5. In some embodiments, the first size is greater than the second size. For example, the first size of the via hole 212A is about 100% to about 50% greater than the second size of the second via hole 212B in diameter. The size difference of the via hole 212A and the via hole 212B may be intentionally formed according to the functions and densities of conducting vias and/or other design requirements. Alternatively, the size difference of the via holes 212A and 212B are inadvertently formed due to inaccuracies of the via hole etching process 214. For example, the via holes 212A and 212B would be confined by other features (e.g., the hard mask layer 210) and have smaller sizes than the original design when the formed via holes 212A and 212B are misaligned respect to the original designed location. While the figures through the description show that the integrated circuit 200 includes only one via hole 212A and one via hole 212B, this is merely an example. The integrated circuit 200 may accommodate any number of via holes depending on different applications and needs.

In some embodiments, both of the via holes 212A and 212B land on the etch stop layer 204. In some embodiments, it is a challenge to make all of the via holes 212A and 212B of different sizes successively land on the etch stop layer 204 due to the loading effect. For example, during the via hole etching process 214, large via holes (e.g., the via holes 212A) may reach the etch stop layer 204 prior to small via holes (e.g., the via holes 212A) since the large via holes can load more etchant. The large via holes may sometimes punch through the etch stop layer 204 and/or perform lateral etch while waiting for the arrival of the small via holes 212B to the etch stop layer 204. The device, such as the devices 206, underlying the etch stop layer 204, would be damaged, and/or wider bottom dimensions would be formed.

In some embodiments, a suitable etch gas 216 is used for the via hole etching process 214 to reduce or eliminate the loading effect while providing a sufficient deep etch depth. The etch gas 216 includes a mixture of $CH_2F_2$ and an auxiliary gas such as $N_2$ or $O_2$. In some embodiments, the etch gas 216 substantially does not include fluorocarbons other than $CH_2F_2$. In some embodiments, the auxiliary gas further includes $C_4F_8$, but its flow rate shall be small, such as not greater than about 50 sccm. In some embodiments, the etch gas 216 is only the mixture of $CH_2F_2$ and the auxiliary gas of $N_2$.

In some embodiments, the via hole etching process 214 includes transferring the integrated circuit 200 as shown in FIG. 2C into a plasma processing chamber and introducing the etch gas 216 including $CH_2F_2$ into the plasma processing chamber. In some embodiments, the $CH_2F_2$ has a flow rate ranging from about 2 sccm to about 50 sccm, and the auxiliary gas has a flow rate ranging from about 3 sccm to about 500 sccm. A ratio of the $CH_2F_2$ and the auxiliary gas in the etch gas 216 may be in a range from about 5 to about 50. A plasma is generated from the etch gas 216 to etch the dielectric layer 208. The plasma may be formed using an RF power ranging from about 50 watts to about 1500 watts. The chamber pressure may keep below about 100 mTorr during the via hole etching process 214. In some embodiments, the chamber pressure keeps below about 50 mTorr in the via hole etching process 214. An overly high pressure in the chamber may aggravate the loading effect and reduce the etch selectivity.

Figure 2E:
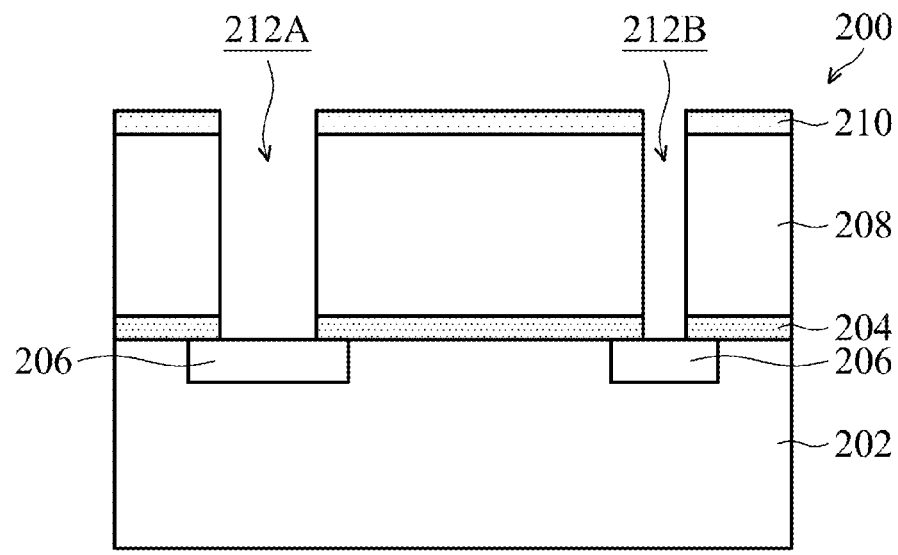

Afterwards, referring to FIG. 1, the method 100 continues to operation 110, in which the etch stop layer is etched through from the via holes. Referring to FIG. 2E, the etch stop layer 204 is etched through and exposes the underlying devices 206. The etch stop layer 204 may be etched by a dry etch process, such as an RIE process. In some embodiments, the etch stop layer 204 may be etched using an etch gas that is different from the etch gas 216 used in the via hole etching process 214. For example, the etch gas used for etching through the etch stop layer 204 may include $CF_4$, $C_2H_6$, $C_4H_8$, $CHF_3$ or a combination thereof (with an auxiliary gas including $O_2$ or $N_2$,). In some embodiments, since the via holes 212A and 212B successively land on the etch stop layer 204, it is easy to control the uniform performance of the etching process of the etch stop layer 204, and the possibility of damaging the underlying devices 206 is reduced. In some embodiments, the hard mask layer 210 is removed after the etch stop layer 204 is etched.

Figure 2F:
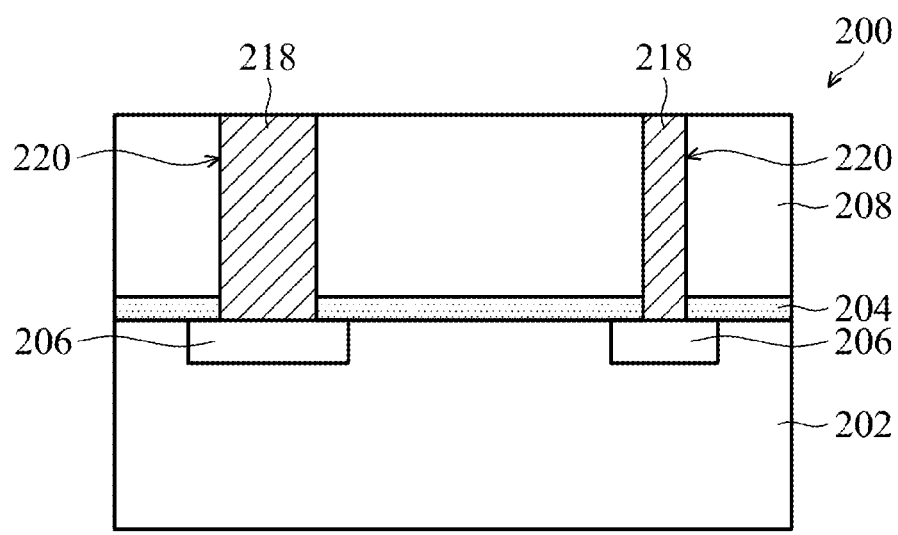

Afterwards, referring to FIG. 1, the method 100 continues to operation 112, in which a conductive material is filled into the via holes. Referring to FIG. 2F, a conductive material 218 is filled into the via holes 212A and the via holes 212A to form conducting vias 220. The conducting vias are connected to the devices 206. The conductive material 218 may include Cu, Al, W, Ti, TiN, Ta, alloys thereof or a combination thereof. In some embodiments, a planarizing process is performed on the conductive material 218 to remove a portion of the conductive material 218 protruding above the dielectric layer 208.

Experiments found that the use of the etch gas including $CH_2F_2$ can provide a high etch selectivity of the dielectric layer 208 with respect to the etch stop layer 204. As a result, the possibility of punching through the etch stop layer 204 when forming the via holes 210A and 210B of different sizes may be reduced or eliminated. The recess amount of forming the via holes 210A and 210B can be easy to control. In addition, the phenomenon of the lateral etch is also eased, as compared to the etch gas including fluorocarbons other than $CH_2F_2$.

Figure 3A:
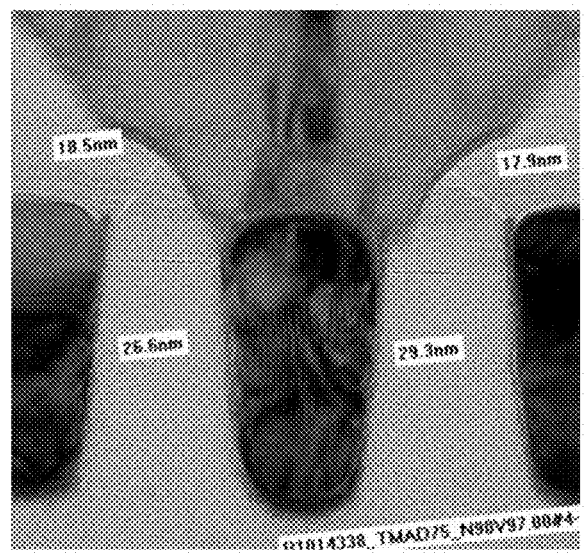
FIGS. 3A and 3B show TEM images of cross-sectional views of conducting vias, in accordance with some embodiments.
Figure 3B:
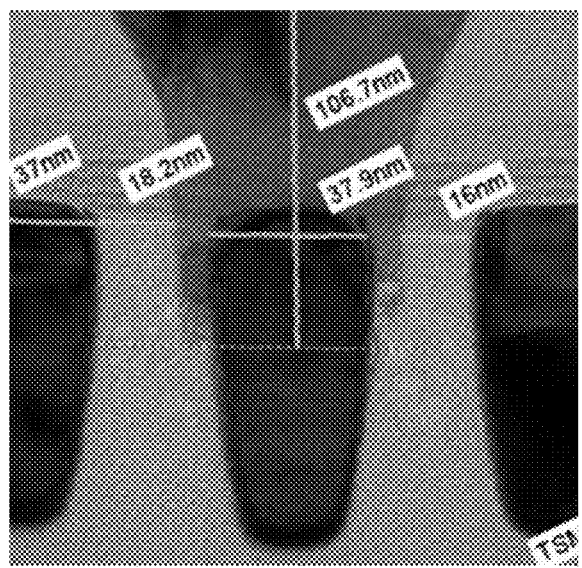

FIGS. 3A and 3B show TEM images of cross-sectional views of conducting vias, in accordance with some embodiments. The conducting via as shown in FIG. 3A was basically formed according to the method 100 as described in FIG. 1, in which the via hole of the conducting via was etched by an etch gas formed of $CH_2F_2$ and $N_2$ with a ratio of 1:4. Meanwhile, the conducting via as shown In FIG. 3B was formed according to the same method of forming the conducting via in FIG. 1 except that the via hole was etched by an etch gas formed of $CF_4$, $C_4H_8$ and $N_2$ with a ratio of 5:1:10. In comparison with the conducting vias in FIGS. 3A and 3B, the conducting via shown in FIG. 3A had substantially the same bottom width as the width of the underlying metal line. In contrast, the conducting via shown in FIG. 3B punched through the etch stop layer and formed a tiger tooth pattern around the upper portion of the underlying metal line, resulting in a wider bottom width. It was observed that the etch gas including $CH_2F_2$ can provide better dimension control for forming conducting vias.

FIGS. 4A-4F are cross-sectional views of an integrated circuit at various stages of fabrication, in accordance with some embodiments. Additional processes may be provided before, during and after the fabrication stages as shown in FIGS. 4A-4F. Various figures have been simplified for better understanding of the concepts of the present disclosure.

Figure 4A:
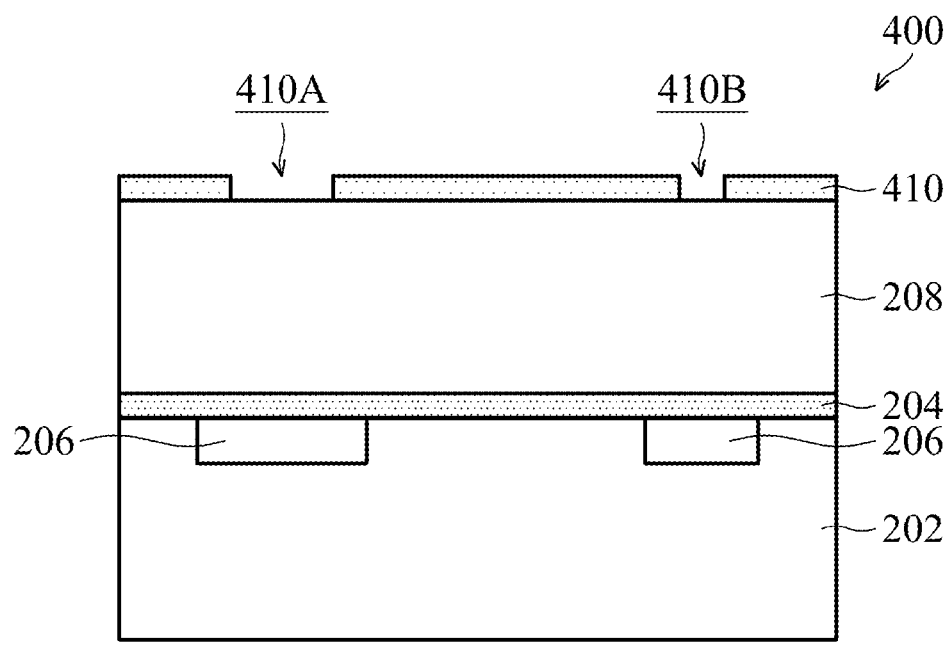
FIGS. 4A-4F are cross-sectional views of an integrated circuit at various stages of fabrication, in accordance with some embodiments.

Referring to FIG. 4A, an integrated circuit 400 similar to the integrated circuit 200 shown in FIG. 2C is provided, and a patterned mask layer 410 is formed over the dielectric layer 208, in accordance with some embodiments. In some embodiments, the patterned mask layer 410 includes openings 410A and 410B for defining trench patterns. In some embodiments, the patterned hard mask layer 140 includes similar material with that of the patterned mask layer 212. In some embodiments, the opening 410A has a greater size (e.g., in diameter) than that of the opening 410B.

Figure 4B:
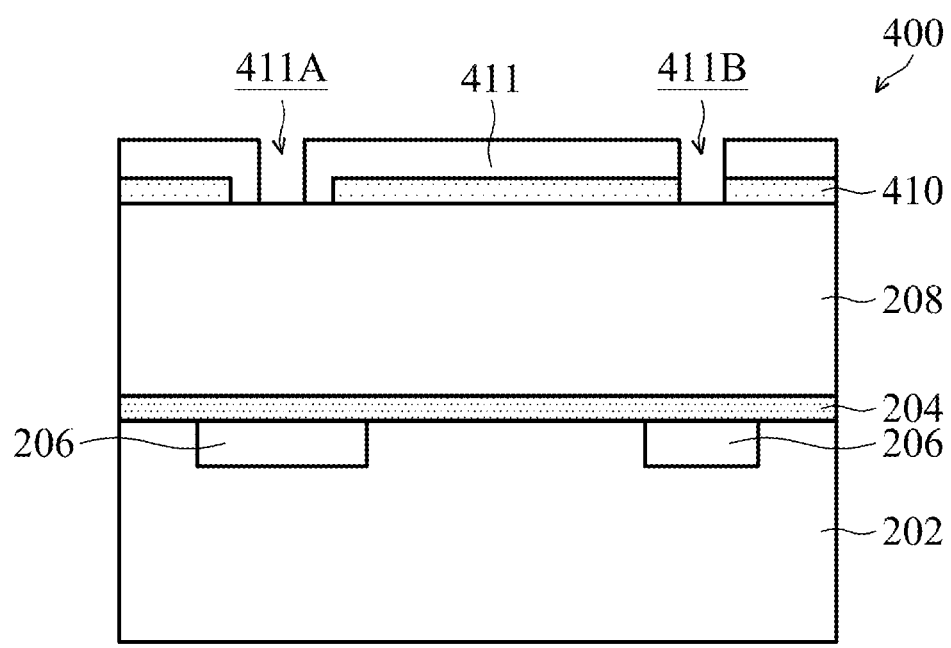

Referring to FIG. 4B, a patterned photoresist layer 412 is formed over the patterned mask layer 410 and the dielectric layer 208, in accordance with some embodiments. The patterned photoresist layer 411 may have openings 411A and 411B exposing a portion of bottoms of the openings 410A and 410B, respectively, for defining via holes' patterns. In some embodiments, the openings 411A and 411B have the same or different sizes, although only the same size is shown in FIG. 4B. In some embodiments, the opening 411A has the same size as that of the opening 410A, and the opening 411B has a smaller size than the opening 410B.

Figure 4C:
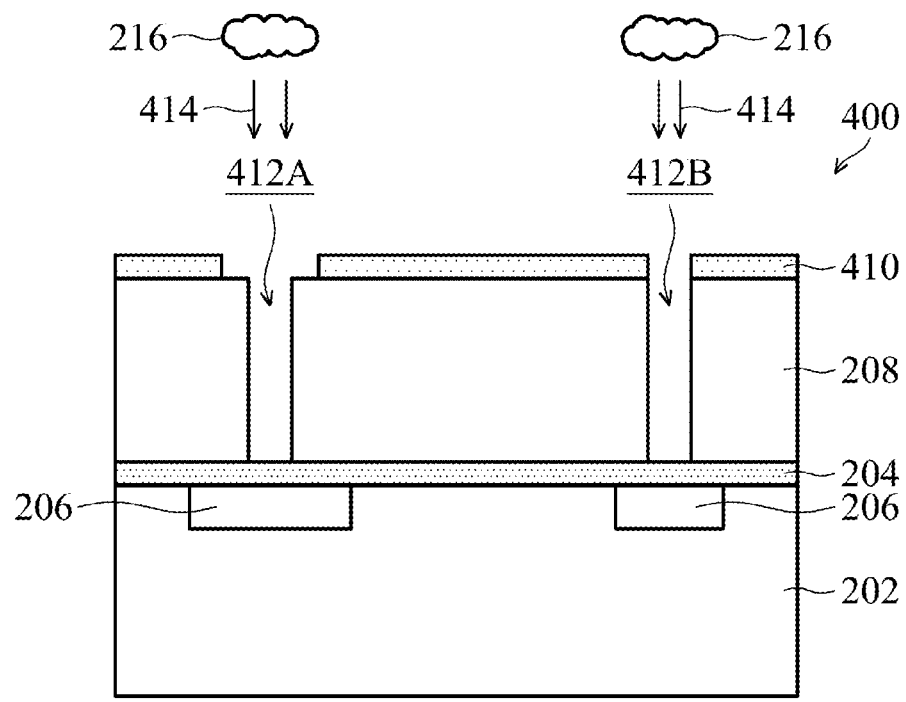

Referring to FIG. 4C, a via hole etching process 414 is performed on the dielectric layer 208 to form via holes 412A and 412B exposing the etch stop layer 204 from the openings 411A and 411B of the patterned photoresist layer 411. In some embodiments, the via hole etching process 414 is a dry etch process using a plasma generated from the etch gas 216. The plasma may be formed using an RF power ranging from about 600 watts to about 1100 watts. In some embodiments, the patterned photoresist layer 411 is removed after the via holes 412A and 412B are formed.

Figure 4D:
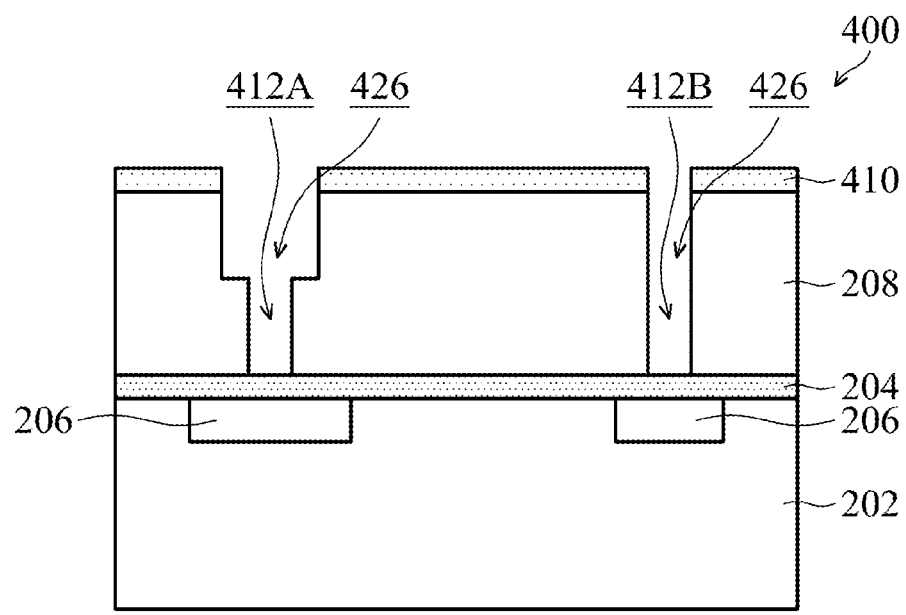

Referring to FIG. 4D, an etching process is performed on the dielectric layer to form trenches 426A and 426B (extending into and out of the paper) on the via hole 412A and the via hole 412B, respectively, from the openings 410A and 410B. The etching process may use any etch gas, such as $CF_4$, $C_2H_6$, $C_4H_8$, $CHF_3$ or a combination thereof.

Figure 4E:
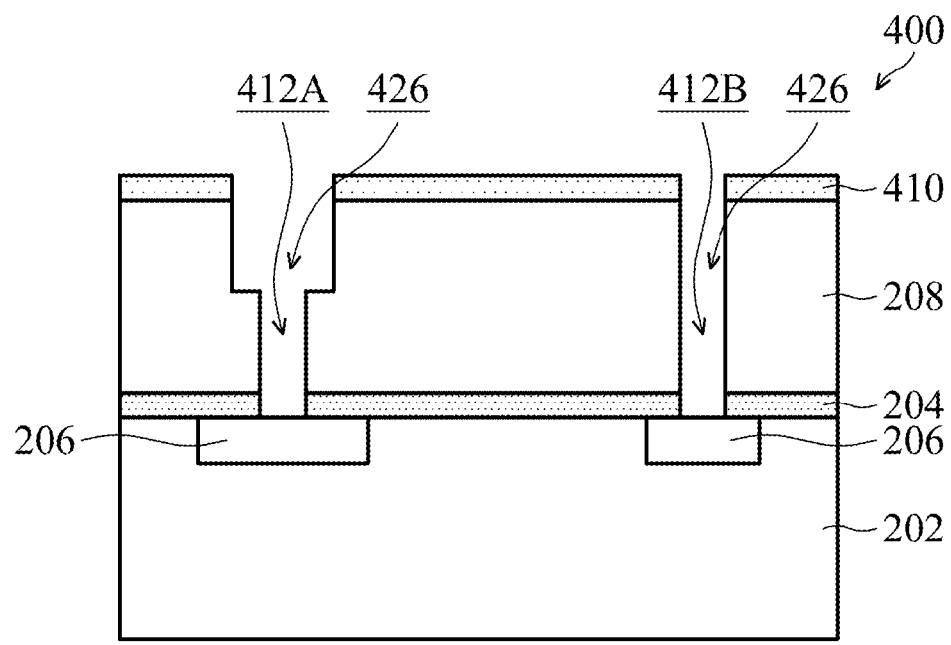
Figure 4F:
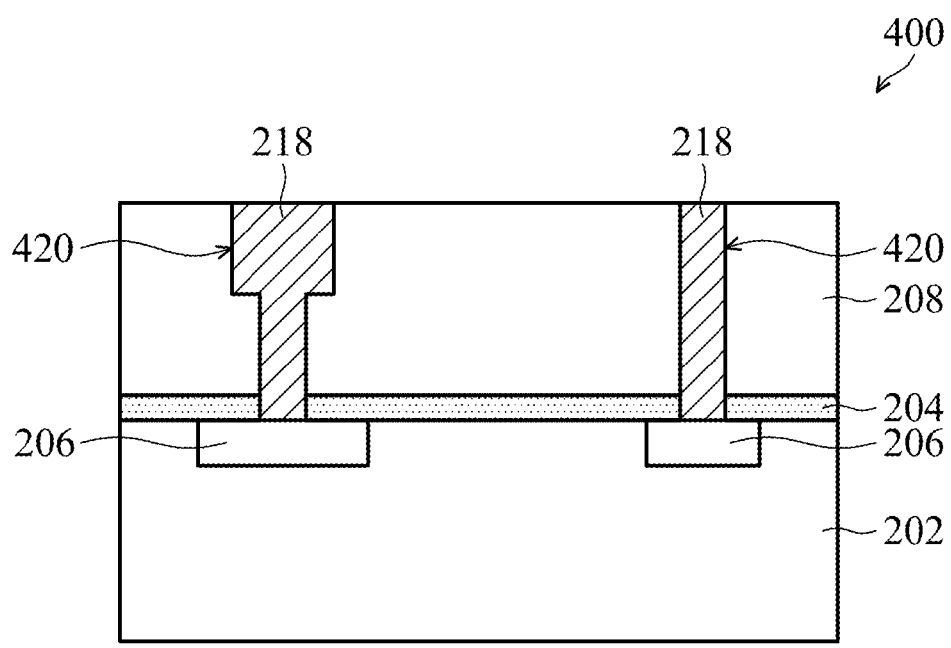

Afterwards, referring to FIG. 4E, the etch stop layer 204 is etched through and exposes the underlying devices 206. In some embodiments, the patterned mask layer 410 is removed after etch stop layer 204 is etched. Afterwards, referring to FIG. 4F, the conductive material 218 is filled into the via holes 412A and 412B and the trenches 426A and 426B to form damascene structures 420.

Figure 5A:
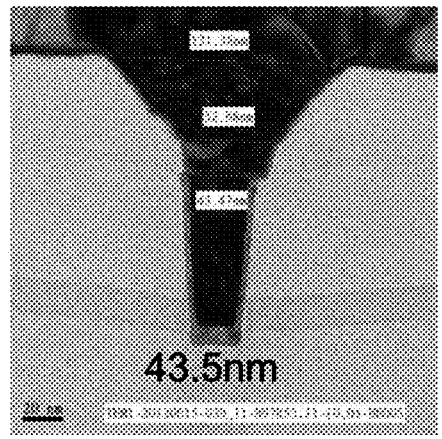
FIGS. 5A-5D show TEM images of cross-sectional views of damascene structures, in accordance with some embodiments.
Figure 5B:
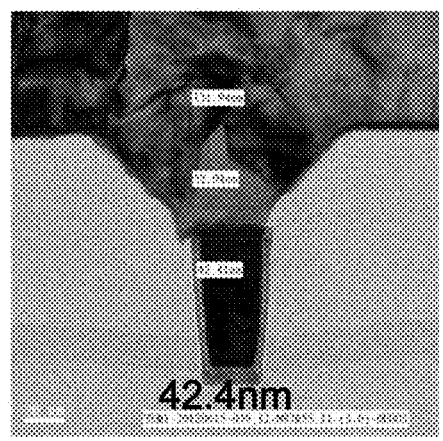
Figure 5C:
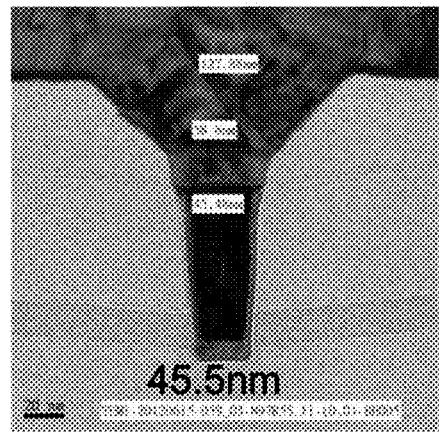
Figure 5D:
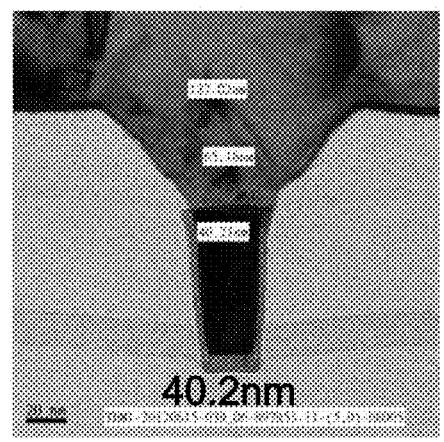

FIGS. 5A and 5D respectively show cross-sectional views of damascene structures, in accordance with some embodiments. The damascene structures as shown in FIGS. 5A and 5B were basically formed according to the operations as shown in FIGS. 4A to 4F. The damascene structure as shown in FIG. 5A had a trench that had substantially twice the diameter than its underlying via hole, and the damascene structure as shown in FIG. 5B had a trench that had substantially the same diameter as its underlying via hole. The etch gas used for forming the via holes was formed of $CH_2F_2$ and $N_2$ with a ratio of about 1:10. The damascene structures as shown in FIGS. 5C and 5D were basically formed according to the same operations as the damascene structures as shown in FIGS. 5A and 5B except the etch gas is formed of $CF_4$, $C_4F_8$ and $N_2$ with a ratio of about 5:1:10. The damascene structure as shown in FIG. 5C had a trench that had substantially twice the diameter than its underlying via hole, and the damascene structure as shown in FIG. 5D had a trench that had substantially the same diameter as its underlying via hole.

As shown In FIGS. 5A and 5B, the critical dimension of via hole in FIG. 5A was about 43.5 nm, and the critical dimension of via hole in FIG. 5B was about 42.4 nm. The via hole in FIG. 5B, which would be confined by the hard mask layer since the opening width of the hard mask layer for defining trenches was almost the same, was only about 2.5% smaller than the via hole in FIG. 5A. However, the via hole in FIG. 5D was about 40.2 nm, which was about 13% smaller than the via hole (about 45.5 nm) in FIG. 5C. It was observed that the use of the $CH_2F_2$ can provide better dimension control for etching via holes.

Embodiments of the present disclosure provide methods for forming via holes of different sizes with high selectivity of an inter-metal dielectric layer with respect to an etch top layer. In some embodiments, the via holes are formed using an etch gas that includes $CH_2F2$ and an auxiliary gas of $N_2$ or $O_2$ for providing the high selectivity and a better dimension control.

In accordance with some embodiments, a method for forming via holes is provided. The method includes providing a substrate with an etch stop layer and a dielectric layer sequentially formed thereon. The method also includes etching the dielectric layer to form a first via hole of a first size and a second via hole of a second size within the dielectric layer by a plasma generated from an etch gas, until both the first via hole and the second via hole are reaching the etch stop layer. The etch gas includes $CH_2F_2$ and an auxiliary gas of $N_2$ or $O_2$.

In accordance with some embodiments, a method for forming conducting vias is provided. The method includes transferring a substrate with an etch stop layer and a dielectric layer sequentially formed thereon into a chamber. The method also includes introducing an etch gas into the chamber. The etch gas includes $CH_2F_2$ and an auxiliary gas of $N_2$ or $O_2$, and a ratio of the $CH_2F_2$ and the auxiliary gas in the etch gas is in a range from about 1 to about 10. The method further includes etching the dielectric layer to form a first via hole of a first size and a second via hole of a second size by a plasma generated from the etch gas, until both the first via hole and the second via hole are reaching the etch stop layer. The pressure in the chamber is in a range from about 15 mTorr to about 200 mTorr during the etch of the dielectric layer. In addition, the method includes etching through the etch stop layer from the first via hole and the second via hole. The method also includes filling a conductive material into the first and second via holes.

In accordance with some embodiments, a method forming a damascene structure is provided. The method includes forming an etch stop layer and a dielectric layer over a substrate sequentially. The method also includes forming a patterned hard mask layer over the dielectric layer, and the patterned hard mask layer has a plurality of first openings for defining trenches. The method further includes forming a patterned photoresist layer over the dielectric layer and the patterned hard mask layer. The patterned photoresist layer has a plurality of second openings exposing at least a portion of the bottoms of the first openings for defining via holes. In addition, the method includes etching the dielectric layer from the second openings to form the via holes within the dielectric layer by a plasma generated from an etch gas, until the via holes are reaching the etch stop layer. The etch gas includes $CH_2F_2$ and an auxiliary gas of $N_2$ or $O_2$. The method also includes removing the patterned photoresist layer. The method further includes etching the dielectric layer from the first openings to form the trenches over the via holes. The method still includes etching thorough the etch stop layer from the via holes. In some embodiments, the method includes removing the patterned hard mask layer. In some embodiments, the method includes filling a conductive material into the trenches and via holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for etching via holes, comprising:
   providing a substrate with an etch stop layer and a dielectric layer sequentially framed thereon;
   concurrently forming a first via hole of a first size and a second via hole of a second size different from the first size within the dielectric layer by a single plasma process;
   reducing loading effect during via formation by providing a first gas mixture consisting essentially of $CH_2F_2$ and $N_2$ until both the first via hole and the second via hole reach the etch stop layer without etching through the etch stop layer, wherein a ratio of $CH_2F_2$ and $N_2$ in the first gas mixture is in a range from about 1 to about 4;
   performing a separate etching process to extend the first and the second via holes through the etch stop layer, the separate etching process utilizing a second gas mixture substantially different from the first gas mixture and comprising $C_2F_6$, $C_4H_8$ or a combination thereof, thereby enabling access to a conductive feature arranged below the etch stop layer.

2. The method as claimed in claim 1, wherein the etch stop layer comprises silicon carbide, silicon carbide oxide, silicon carbide nitride or a combination thereof.

3. The method as claimed in claim 1, wherein the first size of the first via hole is about 100% to about 50% greater than the second size of the second via hole in diameter.

4. The method as claimed in claim 1, wherein a pressure in a chamber is below 50 mTorr during etching of the dielectric layer in the via formation step performed in the chamber, thereby avoiding aggravating the loading effect of the first gas mixture and avoiding reducing an etch selectivity.

5. A method of forming conducting vias, comprising:
   transferring a substrate with an etch stop layer and a dielectric layer sequentially formed thereon into a chamber;
   concurrently forming a first via hole of a first size and a second via hole of a second size different from the first size by a single plasma process;
   reducing loading effect during via formation by providing a first gas mixture consisting essentially of $CH_2F_2$ and $N_2$ until both the first via hole and the second via hole reach the etch stop layer without etching through the etch stop layer, wherein a ratio of $CH_2F_2$ and $N_2$ in the first gas mixture is in a range from about 1 to about 4;
   performing a separate etching process to etch through the etch stop layer from the first via hole and the second via hole, the separate etching process utilizing a second gas mixture substantially different from the first gas mixture and comprising $C_2F_6$, $C_4H_8$ or a combination thereof; and
   filling a conductive material into the first and second via holes.

6. The method of claim 5, wherein the $CH_2F_2$ has a flow rate ranging from about 5 sccm (standard cubic centimeter per minute) to about 50 sccm, and the $N_2$ has a flow rate ranging from about 3 sccm to about 500 sccm during etching of the dielectric layer in the via formation step.

7. The method of claim 5, wherein the etch stop layer comprises silicon carbide, silicon carbide oxide, silicon carbide nitride or a combination thereof.

8. The method of claim 5, wherein the etch stop layer comprises a thickness ranging from about 300 Angstroms to about 1800 Angstroms.

9. The method of claim 5, wherein the first size of the first via hole is about 100% to about 50% greater than the second size of the second via hole in diameter.

10. The method as claimed in claim 5, wherein a pressure in the chamber is below 50 mTorr during etching of the dielectric layer in the via formation step, thereby avoiding aggravating the loading effect of the first gas mixture and avoiding reducing an etch selectivity.

11. A method of forming a damascene structure, comprising:
forming an etch stop layer and a dielectric layer over a substrate sequentially;
forming a patterned hard mask layer over the dielectric layer, wherein the patterned hard mask layer has a plurality of first openings for defining trenches;
forming a patterned photoresist layer over the dielectric layer and the patterned hard mask layer, wherein the patterned photoresist layer has a plurality of second openings exposing at least a portion of bottoms of the first openings for defining via holes;
concurrently forming a first via hole of a first size and a second via hole of a second size different from the first size within the dielectric layer by a single plasma process,
reducing loading effect during via formation by providing a first gas mixture consisting essentially of $CH_2F_2$ and $N_2$ until the via holes reach the etch stop layer without etching through the etch stop layer, wherein a ratio of $CH_2F_2$ and $N_2$ in the first gas mixture is in a range from about 1 to about 4;
removing the patterned photoresist layer;
etching the dielectric layer from the first openings to form a first trench over the first via hole and a second trench over the second via hole;
performing a separate etching process to etch through the etch stop layer from the first via hole and the second via hole, the separate etching process utilizing a second gas mixture substantially different from the first gas mixture and comprising $C_2F_6$, $C_4H_8$ or a combination thereof;
removing the patterned hard mask layer;
filling a conductive material into the first trench, the second trench, the first via hole and the second via hole.

12. The method as claimed in claim 11, wherein one of the first trench and the second trench has a width greater than a diameter of one of the first via hole and the second via hole, and the other one of the first trench and the second trench has a width substantially the same as a diameter of the other one of the first via hole and the second via hole.

13. The method as claimed in claim 12, wherein the one of the first trench and the second trench has a width substantially twice as much as a diameter of the one of the first via hole and the second via hole.

14. The method as claimed in claim 11, wherein the etch stop layer comprises silicon carbide, silicon carbide oxide, silicon carbide nitride or a combination thereof.

15. The method as claimed in claim 11, wherein a pressure in a chamber is below 50 mTorr during a step of etching the dielectric layer from the second openings in the via formation step, thereby avoiding aggravating the loading effect of the first gas mixture and avoiding reducing an etch selectivity.

* * * * *